(12) United States Patent  (10) Patent No.: US 7,573,065 B2
Iijima et al.  (45) Date of Patent: Aug. 11, 2009

(54) SEMICONDUCTOR DEVICE EVALUATION METHOD

(75) Inventors: Ryosuke Iijima, Kawasaki (JP); Masato Koyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 384 days.

(21) Appl. No.: 11/472,449

(22) Filed: Jun. 22, 2006

(65) Prior Publication Data

US 2006/0289863 A1  Dec. 28, 2006

(30) Foreign Application Priority Data

Jun. 23, 2005  (JP)  ............................. P2005-183235

(51) Int. Cl.
*H01L 23/58*  (2006.01)
(52) U.S. Cl. ........................................ 257/48; 257/410
(58) Field of Classification Search .................. 257/48, 257/410
See application file for complete search history.

(56) References Cited

U.S. PATENT DOCUMENTS 6,873,539 B1 * 3/2005 Fazan et al. .................. 365/149

OTHER PUBLICATIONS

Wouters, d.j., et al., "Characterization of Front and Back Si-SiOsub2 interfaces in thick- and thin film silicon-on-insulator MOS strctures by the charge-pumping technique", Sep. 1989, IEEE Trans. Elec. Dev., vol. 36, No. 9, p. 1746-50.*

Kerber, A. et al., "Direct Measurement of the Inversion Charge in MOSFETs: Application to Mobility Extraction in Alternative Gate Dielectrics," 2003 Symposium on VLSI Technology Digest of Technical Papers, 2 Sheets, (2003).

Singh, D.V. et al., "Ultra-Fast Measurements of the Inversion Charge in MOSFETs and Impact on Measured Mobility in High-k MOSFETs" Tech. Dig. of IEDM, 4 Sheets, (2004).

Leroux, C. et al., "Characterization and Modeling of Hysteresis Phenomena in High K Dielectrics," Tech. Dig. of IEDM, 4 Sheets, (2004).

Iijima, R. et al., "Experimental Clarification of Mobility Determing Factors in HfSiON CMISFETs with Various Film Compositions," Tech. Dig. of IEDM, 4 Sheets, (2005).

* cited by examiner

*Primary Examiner*—Howard Weiss
(74) *Attorney, Agent, or Firm*—Finnegan, Henderson, Farabow, Garrett & Dunner, L.L.P.

(57) ABSTRACT

An apparatus for evaluating a field-effect transistor includes a pulse generator, a current/voltage converter, a switch and a first constant-voltage source. The pulse generator can be electrically connected to a gate electrode of a field-effect transistor. The current/voltage converter includes an input terminal. The input terminal can be electrically connected to a first source/drain region of the field-effect transistor. The switch can be electrically connected to a second source/drain region of the field-effect transistor. The switch switches between a connection state and a disconnection state. The first constant-voltage source can be electrically connected to the second source/drain region through the switch.

4 Claims, 8 Drawing Sheets

SEMICONDUCTOR DEVICE EVALUATION METHOD

CROSS-REFERENCE TO RELATED APPLICATIONS

This application is based upon and claims the benefit of priority from the Japanese Patent Application No. 2005-183235 filed on Jun. 23, 2005; the entire contents of which are incorporated herein by reference.

BACKGROUND

1. Field of the Invention

The invention relates to a field-effect semiconductor device evaluation apparatus and a field-effect semiconductor device evaluation method.

2. Description of the Related Art

Reduction in thickness of an $SiO_2$ film used as a gate insulating film has advanced with the advance of fineness in MISFET (Metal-Insulator-Semiconductor Field Effect Transistor). For example, it is considered that an $SiO_2$ film having a thickness of 1 nm or less will be necessary for an MISFET of a generation, which will have a gate length smaller than 50 nm.

In such a thin $SiO_2$ film, there is however a problem that leakage current through the gate insulating film increases. As a measure against this problem, an attempt has been made to use a substance having a high dielectric constant compared with $SiO_2$, for the gate insulating film.

It has been known here that carrier mobility of the MISFET in the case where such a high dielectric constant gate insulating film (so-called high-k insulating film) is applied to an actual device is different from that in the case of $SiO_2$. It is therefore necessary to design a highly integrated circuit appropriately after exactly grasping the carrier mobility of the MISFET, which varies according to the high dielectric constant material, in order to use the high-k insulating film efficiently in the highly integrated circuit.

It is however difficult to evaluate the mobility of a high-k MISFET. Generally, a large number of levels capable of trapping electric charge are in the high-k insulating film unlike the case of $SiO_2$. In a conventional evaluation method (Split-CV method), electrification is caused by electric charge trapped by levels in the film when the gate voltage is applied. Because the electrification exerts a bad influence on analysis, the mobility cannot be estimated correctly.

There have been recently proposed several methods in which the time of application of the gate voltage is shortened (the gate voltage is input as a pulse voltage) to prevent levels in the high-k insulating film from trapping electric charge to thereby estimate the mobility accurately (see Non-Patent Documents 1 and 2).

[Non-Patent Document 1] A. Kerber et al. "Direct Measurement of the Inversion Charge in MOSFETS: Application to Mobility Extraction in Alternative Gate Dielectrics", Symp. On VLSI Tech., p. 159 (2003)

[Non-Patent Document 2] D. V. Singh et al. "Ultra-fast Measurements of the Inversion Charge in MOSFETs and Impact on Measured Mobility in High-k MOSFETs", Tech. Dig. of IEDM, p. 863 (2004)

Each of these evaluation methods, however, has any one of the following problems.

In the evaluation method represented by Non-Patent Document 1, it is necessary to apply "continuous" pulses for measurement.

If such continuous pulses are used, trapping of electric charge is caused by application of a gate voltage even though the gate voltage is a pulse voltage. This problem arises more remarkably as the frequency becomes higher. If a long time is set for application of the continuous pulses to obtain high accuracy in measurement, characteristic of the MISFET to be evaluated changes or crashes. It is hence difficult to calculate mobility accurately.

In the evaluation method represented by Non-Patent Document 2, respective measuring systems for measuring inversion layer carrier density Ns and inversion layer sheet resistance ρch necessary for deduction of mobility are different from each other.

When the two physical quantities Ns and ρch are measured by different measuring systems, strict correspondence between the two physical quantities is spoiled so that variations according to measurement conditions become large. As a result, accurate mobility cannot be estimated. Moreover, when measurement is shifted from one measuring system to the other measuring system, a great deal of time and labor is required.

Specifically, at the time of measuring ρch, the source terminal is electrically connected to the ground. Accordingly, the electric potential of the inversion layer formed in a surface of the MISFET is unchanged because the electric potential of the source region is always fixed at a ground level. On the other hand, at the time of measuring Ns, the source and drain terminals are electrically connected to each other and electrically connected to the ground through a capacitor. Accordingly, the electric potential of the inversion layer formed in the surface of the MISFET varies during measurement. As a result, the potential environments for the inversion layer at the times of measuring the two physical quantities are different from each other.

It is therefore necessary to construct an evaluation method in which the two problems can be solved at once to estimate mobility of the high-k MISFET accurately.

BRIEF SUMMARY

According to an aspect of the invention, an apparatus for evaluating a field-effect transistor includes a pulse generator, a current/voltage converter, a switch and a first constant-voltage source. The pulse generator can be electrically connected to a gate electrode of the field-effect transistor. The current/voltage converter includes an input terminal. The input terminal can be electrically connected to a first source/drain region of the field-effect transistor. The switch can be electrically connected to a second source/drain region of the field-effect transistor. The switch switches between a connection state and a disconnection state. The first constant-voltage source can be electrically connected to the second source/drain region through the switch.

According to another aspect of the invention, an apparatus for evaluating a field-effect transistor includes a pulse generator, a first current/voltage converter, a first constant-voltage source and a second current/voltage converter. The pulse generator can be electrically connected to a gate electrode of the field-effect transistor. The first current/voltage converter includes a first input terminal and a second input terminal. The first input terminal can be electrically connected to a first source/drain region of the field-effect transistor. The first constant-voltage source is electrically connected to the second input terminal of the first current/voltage converter. The second current/voltage converter includes a first input terminal. The first input terminal of the second current/voltage converter is electrically connected to a second source/drain region of the field-effect transistor.

According to further another aspect of the invention, a method for evaluating a field-effect transistor includes: forming a potential difference between a first terminal electrically connected to a source region of the field-effect transistor and a second terminal electrically connected to a drain region of the field-effect transistor; applying monopulse voltage to a gate electrode of the field-effect transistor to change the field-effect transistor from a depletion state to an inversion state; measuring temporal change in source current flowing through the first terminal when the monopulse voltage is applied; measuring temporal change in drain current flowing through the second terminal when the monopulse voltage is applied; obtaining a channel current in an operating state of the field-effect transistor, based on a current value calculated by dividing an algebraic difference between the source current and the drain current by 2; obtaining a quantity of inversion layer charge in the operating state of the field-effect transistor, based on a temporally integrated current value calculated as an algebraic sum of the source current and the drain current; and obtaining mobility of a carrier based on the channel current and the quantity of the inversion layer charge.

The invention provides a semiconductor device evaluation apparatus and a semiconductor device evaluation method in which monopulse measurement can be made and in which both inversion layer carrier density Ns and inversion layer sheet resistance ρch can be measured by one and the same measuring system.

DETAILED DESCRIPTION OF EMBODIMENTS OF THE INVENTION

Embodiments of the invention will be described below with reference to the drawings. Incidentally, constituent parts common to the embodiments are referred to by the same numerals for the sake of omission of duplicated description. The respective drawings are typical views for explaining the invention and promoting understanding of the invention. Although the apparatus shown in each of the drawings may be different in shape, size, ratio, etc. from the actual apparatus, the design of the apparatus can be changed suitably in consideration of the following description and the background art.

First Embodiment

Figure 1:
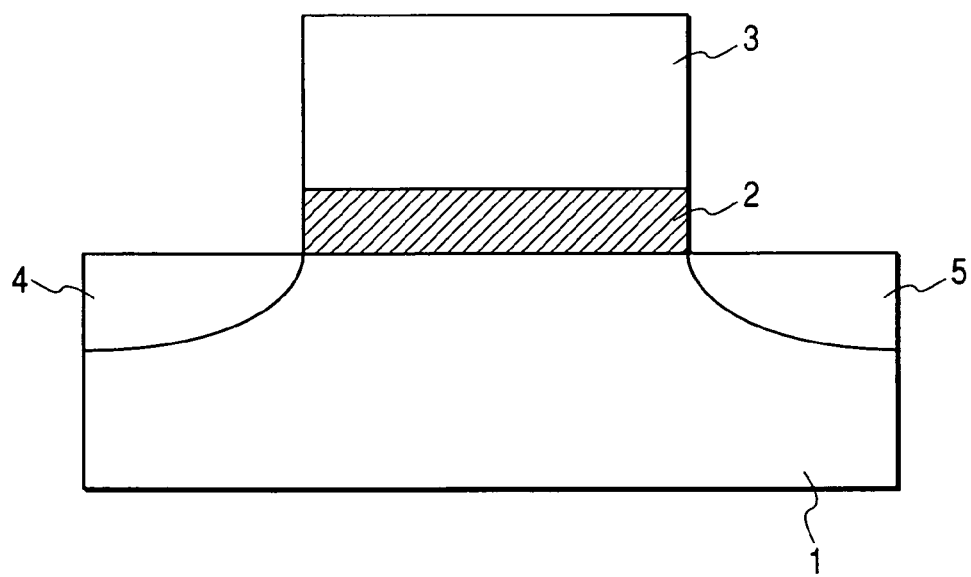
FIG. 1 is a sectional view showing the general structure of an MIS type field-effect transistor.

As shown in FIG. 1, a semiconductor device with electric characteristic to be evaluated in a first embodiment is an MIS type field-effect transistor (hereinafter referred to as "MISFET"), which includes a semiconductor substrate 1 (e.g. silicon substrate), a gate insulating film 2 provided on the semiconductor substrate 1, a gate electrode 3 (e.g. polycrystal silicon) provided on the gate insulating film 2, and source and drain regions 4 and 5 provided in the semiconductor substrate 1 and on opposite sides of the gate electrode 3. The MISFET may be an N-type MISFET or a P-type MISFET.

Examples of the material of the semiconductor substrate 1 include Si, SiGe, Ge, distorted Si, etc.

A silicon oxide film or an electrically insulating film (high dielectric insulating film) having a higher dielectric constant than that of the $SiO_2$ film is used as the gate insulating film 2. Examples of the material of the high dielectric insulating film include $Si_3N_4$, $Al_2O_3$, $Ta_2O_5$, $TiO_2$, $La_2O_5$, $CeO_2$, $ZrO_2$, $HfO_2$, $SrTiO_3$, $Pr_2O_3$, etc. A mixture material of silicon oxide and metal ions, such as Zr silicate or Hf silicate, may be used as the material of the high dielectric insulating film. These materials may be used in combination. Specific examples include ZrSiO, HfSiO, LaSiO, ZrSiON, HfSiON, LaSiON, etc.

A semiconductor device evaluation apparatus according to the first embodiment is particularly excellent in evaluation of a semiconductor device using such a high dielectric insulating film.

Figure 2:
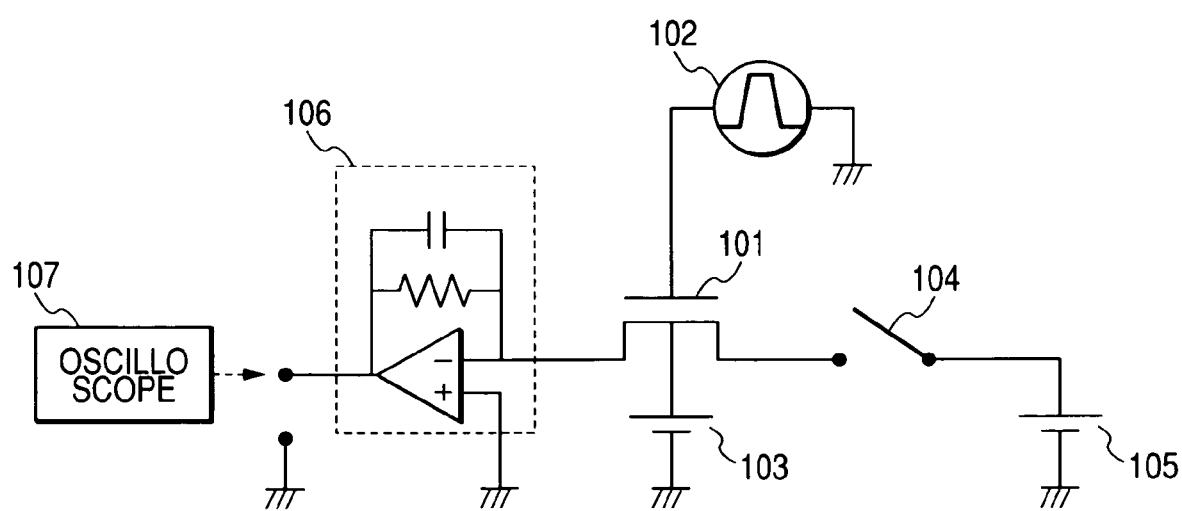
FIG. 2 is a circuit diagram showing an example of a semiconductor device evaluation apparatus according to a first embodiment.

FIG. 2 shows an example of the semiconductor device evaluation apparatus according to the first embodiment.

A pulse generator 102 is electrically connected to a gate electrode of an MISFET 101. A constant-voltage source 103 is electrically connected to a substrate of the MISFET 101. A constant-voltage source 105 is electrically connected to a drain region of the MISFET 101 through a switch 104, which switches between a connection state and a disconnection state. A current/voltage converter 106 is electrically connected to a source region of the MISFET 101. An output voltage of the current/voltage converter 106 is measured with an oscilloscope (voltmeter) 107.

Of course, the apparatus and the MISFET are electrically connected to each other via terminals such as an input terminal, an output terminal, a gate electrode terminal, a source terminal, a drain terminal, a substrate terminal, etc.

On this occasion, the speed of response of the oscilloscope 107 may be higher than that of the current/voltage converter 106. Specifically, the speed of response of the oscilloscope 107 is not lower than ten times that of the current/voltage converter 106.

For example, Model-428 made by Keithley Instruments, Inc. can be used as the current/voltage converter 106.

Any device can be used as the constant-voltage source 103. When the constant-voltage source 103 is used, desirable voltage can be applied to the substrate of the MISFET 101. Accordingly, mobility can be evaluated under any substrate bias condition. Of course, the constant-voltage source 103 can apply a voltage of 0 V. In this case, mobility can be evaluated under a zero substrate bias condition.

An example of a semiconductor device evaluation method using the semiconductor device evaluation apparatus according to the first embodiment will be described below, on the assumption that the MOSFET 101 shown in FIG. 2 is an N-type MISFET.

First, the constant-voltage source 105 is set to generate a positive voltage Vd having a small absolute value (e.g. Vd=+10 mV).

Figure 3:
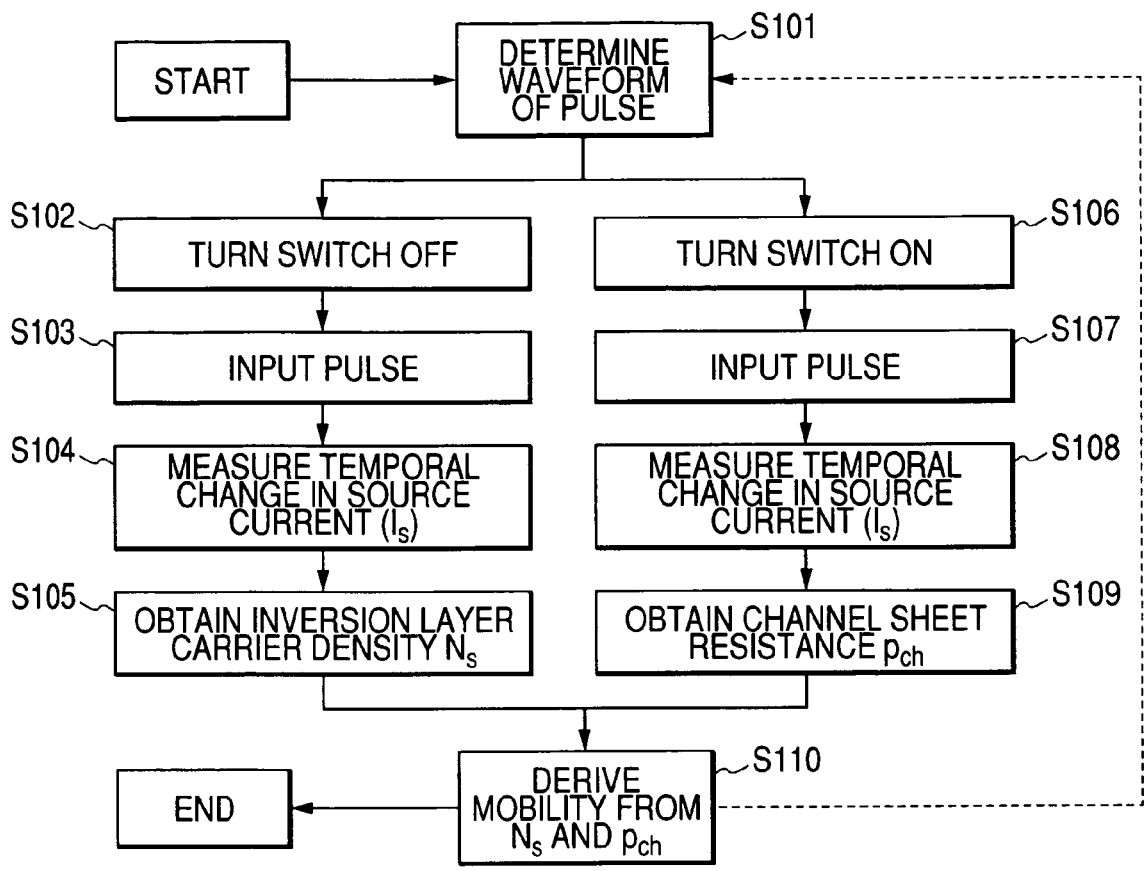
FIG. 3 is a flow chart showing an example of a semiconductor device evaluation method according to the first embodiment.

FIG. 3 shows a procedure for deriving mobility of the MISFET. A series of steps including steps S102 to S105 for estimating inversion layer carrier density Ns may be carried out before or after a series of steps including steps S106 to S109 for estimating channel sheet resistance ρch. The respective steps will be described below in detail.

Step S101: This step determines the waveform of a pulse voltage applied from the pulse generator 102 to the gate electrode of the MISFET 101 in FIG. 2. The pulse voltage has a waveform to change the MISFET 101 from a depletion state to an inversion state.

Figure 4:
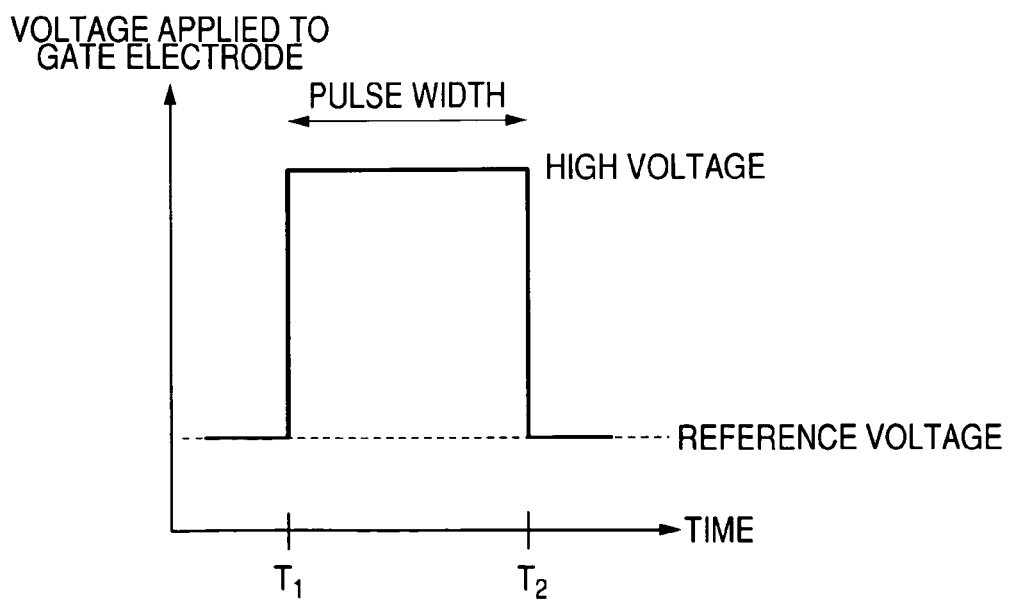
FIG. 4 is a graph for explaining an example of the waveform of a pulse voltage applied to a gate electrode to deduce mobility.

FIG. 4 shows an example of the pulse waveform.

As shown in FIG. 4, a pulse having a constant voltage is applied to the gate electrode. Except the time of application, the gate voltage is kept constant at a reference voltage. It is essential that the inversion layer of the MISFET disappears perfectly while the reference voltage is applied, i.e. the inversion layer of the MISFET is in a depletion state while the reference voltage is applied. It is therefore necessary that the reference voltage is lower in voltage value than a threshold voltage of the MISFET. For example, the reference voltage may be −1 V. The MISFET is in an inversion state during a time period in which the high voltage is applied. It is necessary to set the high voltage to be higher in voltage value than the threshold voltage of the MISFET. Change in voltage value permits the strength of the inversion state to be controlled.

Figure 5:
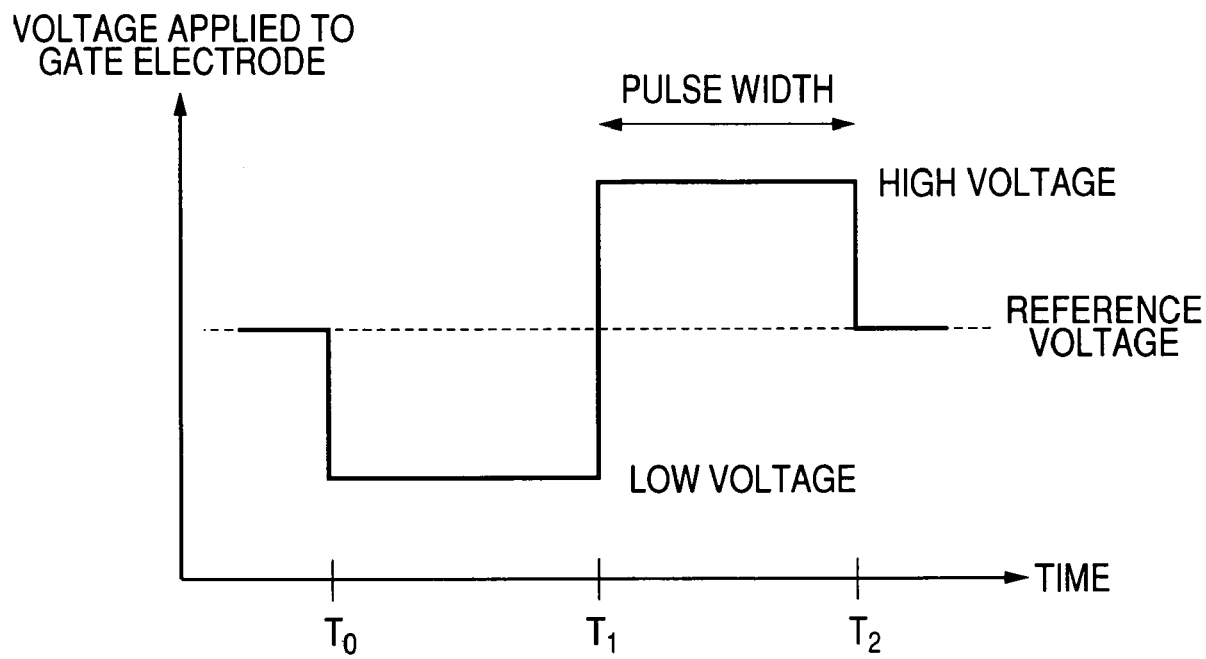
FIG. 5 is a graph for explaining an example of the waveform of a pulse voltage applied to a gate electrode to deduce mobility.

The pulse waveform may be shaped as shown in FIG. 5.

As shown in FIG. 5, a constant voltage lower than the reference voltage is applied and then a constant voltage higher than the reference voltage is applied. Except the time when pulses are applied to the gate electrode for a predetermined time, the gate voltage is kept constant at the reference voltage. The reference voltage can be set at an arbitrary voltage value. For example, the reference voltage may be 0 V. The MISFET is in an inversion state during a time period in which the high voltage is applied. It is necessary to set the high voltage to be higher in voltage value than the threshold voltage of the MISFET. Change in voltage value permits the strength of the inversion state to be controlled. It is essential that the inversion layer of the MISFET disappears perfectly during a time period in which the low voltage is applied, i.e. the inversion layer of the MISFET is in a depletion state during a time period in which the low voltage is applied. It is therefore necessary that the low voltage is lower in voltage value than the threshold voltage of the MISFET. For example, the low voltage may be −1 V.

Use of the pulse waveform shown in FIG. 5 brings the following advantage compared with use of the pulse waveform shown in FIG. 4.

Except the time when the pulse voltage is being applied, the gate voltage is kept constant at the reference voltage. For this reason, the charge state of levels in the insulating film can be controlled by the reference voltage in the case where either of the pulse waveforms shown in FIGS. 4 and 5 is used. In the case of the pulse waveform shown in FIG. 4, since the reference voltage is required to be not higher than the threshold voltage, the reference voltage cannot be set desirably. On the contrary, in the case of the pulse waveform shown in FIG. 5, the reference voltage can be set desirably. Accordingly, for example, use of the pulse waveform shown in FIG. 5 permits correlation between the charge state of the levels and mobility to be examined in detail.

In each of the pulse waveforms shown in FIGS. 4 and 5, if the high voltage is applied for an excessively long time (pulse width is too long), the levels in the insulating film trap electric charges and thus electrification is caused in the insulating film. Therefore, the upper limit of the pulse width is defined on the basis of time constant of charge trapping. On the other hand, to measure current flowing in the channel of the MISFET with the oscilloscope 107 through the current/voltage converter 106, the high voltage needs to be kept while being applied for a predetermined time corresponding to the response speed of the current/voltage converter. The response speed of the current/voltage converter is decided by a feedback loop of an operational (OP) amplifier inside the converter. When a circuit having a resistor (R) and a capacitor (C) arranged in parallel to each other is used as the feedback loop, a characteristic response time is obtained as RC, which defines the lower limit of the pulse width.

Therefore, the pulse width may be in a range of from the lower limit to the upper limit as described above.

For example, in the high-k insulating film, the time constant of charge trapping is not longer than 0.1 sec. On the assumption that a circuit having a resistor of 1 kΩ and a capacitor of 10 pF arranged in parallel to each other is used as the feedback loop, the pulse width may be in a range of from 10 nsec to 0.1 sec, especially in a range of from 100 nsec to 1 μs.

Particularly in hafnium silicon oxynitride, the time constant of charge trapping is 100 μsec. On the assumption that a circuit having a resistor of 1 kΩ and a capacitor of 10 nF arranged in parallel to each other is used as the feedback loop, the pulse width may be set to be in a range of from 10 μsec to 100 μsec.

In the pulse waveform shown in FIG. 5, when the low voltage is applied for an excessively long time, electrification is caused by release of electric charge in the levels of the insulating film. On the other hand, to make the current/voltage converter follow change of the inversion state of the MISFET, the low voltage needs to be kept while being applied for a predetermined time corresponding to the response speed of the current/voltage converter.

Therefore, the time for which the low voltage is applied may be substantially equal to the time for which the high voltage is applied.

Although FIGS. 4 and 5 show the case where each pulse is shaped like a rectangle for the sake of convenience, it is a matter of course that the rising edge of the rectangle may be inclined or each corner of the rectangle may be curved due to general influence of peripheral circuits.

Steps S102, S103, S104 and S105: This series of steps for estimating inversion layer carrier density Ns will be described.

Step S102: The switch 104 is turned off (into a wire disconnection state).

Step S103: The voltage pulse determined in the step S101 is input from the pulse generator 102 to the gate electrode of the MISFET 101. The pulse waveform shown in FIG. 4 or 5 is input as a monopulse.

To control the charge state of the levels in the insulating film on the basis of the reference voltage, the hold time of the reference voltage is required to be sufficiently longer than the time constant of charge trapping. Accordingly, a monopulse with the pulse waveform shown in FIG. 4 or 5 may be applied several times at intervals a lower limit of which is the time constant of charge trapping.

The repetition of application of the monopulse is effective in numerically averaging the output voltage of the current/voltage converter 106 with the oscilloscope 107 to thereby reduce the influence of noise in step S104, which will be described later.

For example, in the case of a high-k insulating film, the charge state of the levels sufficiently reaches an equilibrium state typically in a time of 100 μsec or longer. Therefore, the interval of application of the monopulse may be equal to or longer than 100 μsec when the monopulse is applied several times.

Particularly, in the case of hafnium silicon oxynitride, the charge state of the levels sufficiently reaches an equilibrium state typically in a time of 1 sec. Therefore, the interval of application of the monopulse may be equal to or longer than 1 sec when the monopulse is applied several times.

Figure 6:
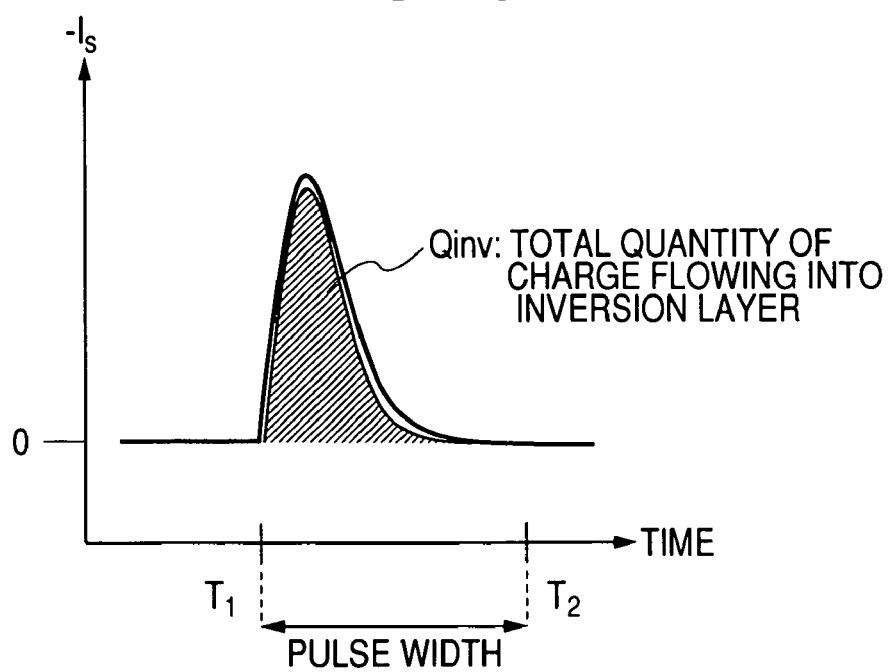
FIG. 6 is a graph showing temporal change in source current measured to estimate inversion layer carrier density.

Step S104: A source current corresponding to the input of the pulse voltage is converted into a voltage signal by the current/voltage converter 106. The voltage signal is measured with the oscilloscope 107. The temporal change in the voltage measured with the oscilloscope 107 is converted into temporal change in source current (Is) on the basis of a conversion rate in the current/voltage converter 106. The source current Is is defined on the assumption that the direction of the current flowing from the current/voltage converter 106 to the source terminal is a positive direction. The temporal change in source current is typically as shown in FIG. 6. In the time of application of the high voltage (i.e. in the pulse width), the source current reaches its maximum and then converges into zero.

Step S105: The source current shown in FIG. 6 expresses a flow of charge from the source region into the inversion layer in a process of formation of the inversion layer. Therefore, the source current is integrated with respect to time in the period of the pulse width to thereby calculate the total quantity Qinv of charge in the inversion layer. Inversion layer carrier density Ns is calculated in accordance with the expression Ns=Qinv/(eWL) in which e is elementary electric charge, W is the gate width of the MISFET 101, and L is the gate length of the MISFET 101.

Incidentally, after the step S105, the step of correcting the inversion layer carrier density Ns may be provided in consideration of the influence of the voltage Vd set in the constant-voltage source 105. By this step, measurement accuracy can be improved more greatly.

An example of the correction method will be described below specifically. The voltage of the constant-voltage source 103 is set to be lower by Vd. The pulse waveform is set to be such a new waveform that the voltage value of the high voltage is lower by Vd. The series of steps S102, S103, S104 and S105 is carried out again. While the inversion layer carrier density under the new condition is regarded as Ns', the average (Ns+Ns')/2 of the inversion layer carrier density Ns and the inversion layer carrier density Ns' can be regarded as corrected inversion layer carrier density in consideration of the influence of Vd.

Steps S106, S107, S108 and S109: The series of steps for estimating channel sheet resistance ρch will be described.

Step S106: The switch 104 is turned on (into a wire connection state).

Step S107: The voltage pulse determined in the step S101 is input from the pulse generator 102 to the gate electrode of the MISFET 101. The pulse waveform shown in FIG. 4 or 5 is input as a monopulse.

To control the charge state of the levels in the insulating film on the basis of the reference voltage, the hold time of the reference voltage is required to be sufficiently longer than the time constant of charge trapping in the levels. Accordingly, a monopulse with the pulse waveform shown in FIG. 4 or 5 may be applied several times at such intervals a lower limit of which is the time constant of charge trapping.

The repetition of application of the monopulse is effective in numerically averaging the output voltage of the current/voltage converter 106 with the oscilloscope 107 to thereby reduce the influence of noise in step S108, which will be described later.

For example, in the case of a high-k insulating film, the charge state of the levels sufficiently reaches an equilibrium state typically in a time of 100 μsec or longer. Therefore, the interval of application of the monopulse may be equal to or longer than 100 μsec when the monopulse is applied several times.

Particularly, in the case of hafnium silicon oxynitride, the charge state in the levels sufficiently reaches an equilibrium state typically in a time of 1 sec. Therefore, the interval of application of the monopulse may be equal to or longer than 1 sec when the monopulse is applied several times.

Figure 7:
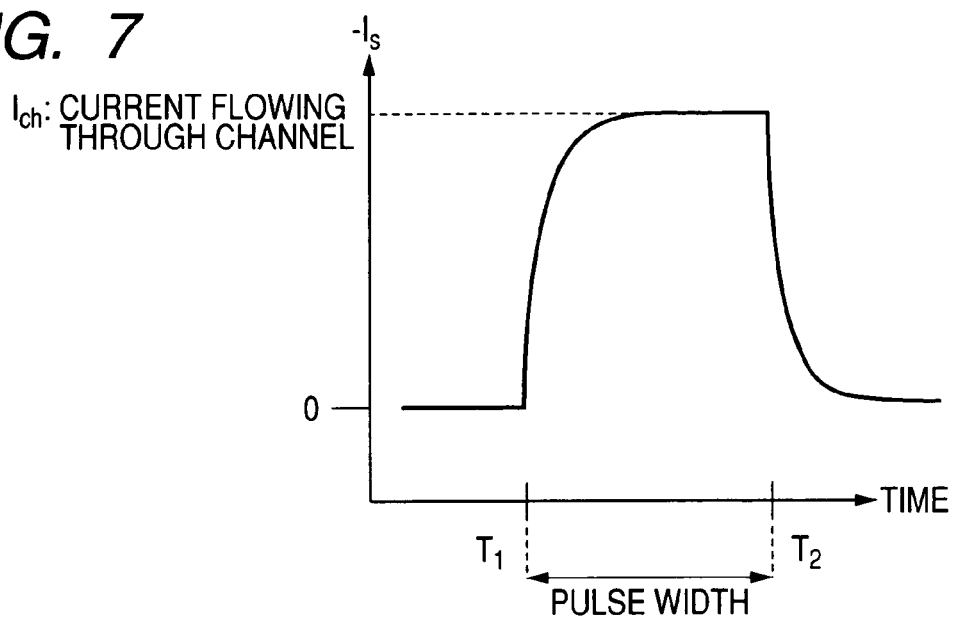
FIG. 7 is a graph showing temporal change in source current measured to estimate channel sheet resistance.

Step S108: A source current corresponding to the input of the pulse voltage is converted into a voltage signal by the current/voltage converter 106. The voltage signal is measured with the oscilloscope 107. The temporal change in the voltage measured with the oscilloscope 107 is converted into temporal change in source current (Is) on the basis of a conversion rate in the current/voltage converter 106. The source current Is is defined on the assumption that the direction of the current flowing from the current/voltage converter to the source terminal is the positive direction. The temporal change in source current is typically as shown in FIG. 7. In the time of application of the high voltage (i.e. in the pulse width), the current converges into a certain value Ich.

Step S109: Ich in the step S108 is a current flowing in the channel of the MISFET 101. Channel sheet resistance ρch is calculated in accordance with ρch=(Vd/Ich)(W/L).

Step S110: Mobility µeff is obtained in accordance with µeff=1/(eρchNs).

Mobility is a physical quantity, which varies in dependence on the strength of the inversion state of the MISFET. The strength of the inversion state is determined uniquely in accordance with the voltage value of the high voltage provided as the pulse voltage applied to the gate electrode. Accordingly, when change of mobility in accordance with change of the inversion state of the MISFET needs to be evaluated, the process goes back to the step S101 to change the voltage value of the high voltage appropriately again and then repeat the steps S102, S103, S104, S105, S106, S107, S108, S109 and S110.

Figure 8:
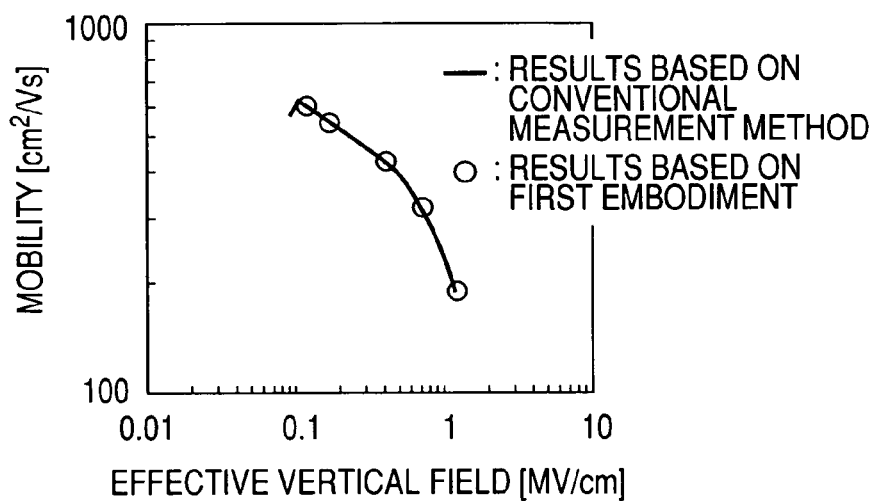
FIG. 8 is a graph showing mobility of an MISFET using $SiO_2$ as an electrically insulating film for comparison between the case where the mobility is deduced by the evaluation method according to the first embodiment and the case where the mobility is deduced by a conventional evaluation method.
Figure 9:
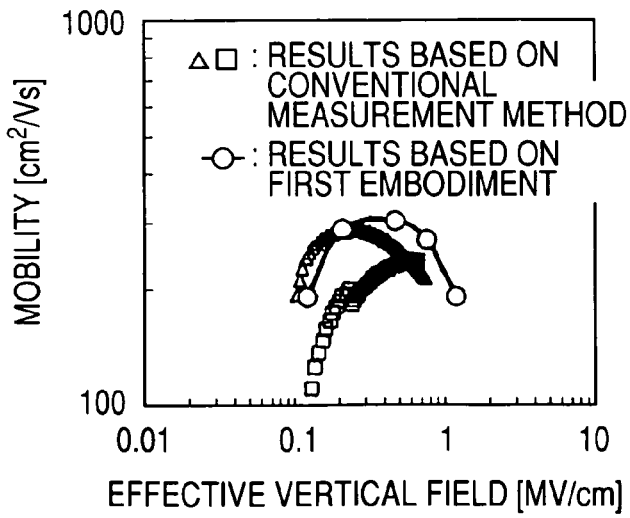
FIG. 9 is a graph showing mobility of an MISFET using a high dielectric constant material as an electrically insulating film for comparison between the case where the mobility is deduced by the evaluation method according to the first embodiment and the case where the mobility is deduced by a conventional evaluation method.

FIGS. 8 and 9 show examples of typical evaluation results. FIG. 8 shows the case where the gate insulating film is made of $SiO_2$. FIG. 9 shows the case where the gate insulating film is made of hafnium silicon oxynitride (HfSiON), which is one of high dielectric constant materials. In each of FIGS. 8 and 9, the vertical axis represents mobility and the horizontal axis represents effective vertical field, which is an index for indicating the strength of the inversion state of the MISFET. As the effective vertical field increases, the inversion state becomes stronger.

In the case where the gate insulating film is made of $SiO_2$ (FIG. 8), the result based on the example of the invention is well consistent with the result based on the conventional evaluation method (Split-CV method). In the case of $SiO_2$ in which the number of levels capable of trapping electric charge in the gate insulating film is small, it is known that mobility can be estimated sufficiently accurately by the conventional Split-CV method. It is apparent from FIG. 8 that mobility can be obtained accurately by use of the semiconductor device evaluation apparatus or the semiconductor device evaluation method according to the first embodiment.

On the other hand, in the case where the gate insulating film is made of hafnium silicon oxynitride (HfSiON), which is one of high dielectric constant materials (FIG. 9), the result based on the example of the invention is different from the result based on the conventional Split-CV method. Moreover, the result based on the example of the invention does not vary whereas the result based on the conventional Split-CV method varies.

This shows the fact that, when a large number of levels capable of trapping electric charge are in the gate insulating film, e.g. made of hafnium silicon oxynitride, mobility cannot be estimated correctly by the conventional Split-CV method because of the influence of the levels. On the contrary, this shows the fact that, when the evaluation apparatus according to the first embodiment of the invention is used, mobility can be estimated accurately without influence of the levels.

According to the first embodiment, a "mono"-pulse can be applied to the gate electrode to estimate mobility. Accordingly, the charge state in the gate insulating film in the MISFET 101 can be sufficiently prevented from being disturbed by application of the gate voltage.

According to the first embodiment, while one measuring system for measuring both Ns and ρch is used, a pulse voltage with the same waveform can be input to the gate electrode to estimate mobility. Accordingly, there is an advantage that mobility derived from Ns and ρch having strict correspondence with each other is very accurate.

Second Embodiment

A semiconductor device with electric characteristic to be evaluated in a second embodiment is the same as that in the first embodiment.

A semiconductor device evaluation apparatus according to the second embodiment is particularly excellent in evaluation of a semiconductor device using a high dielectric insulating film.

Figure 10:
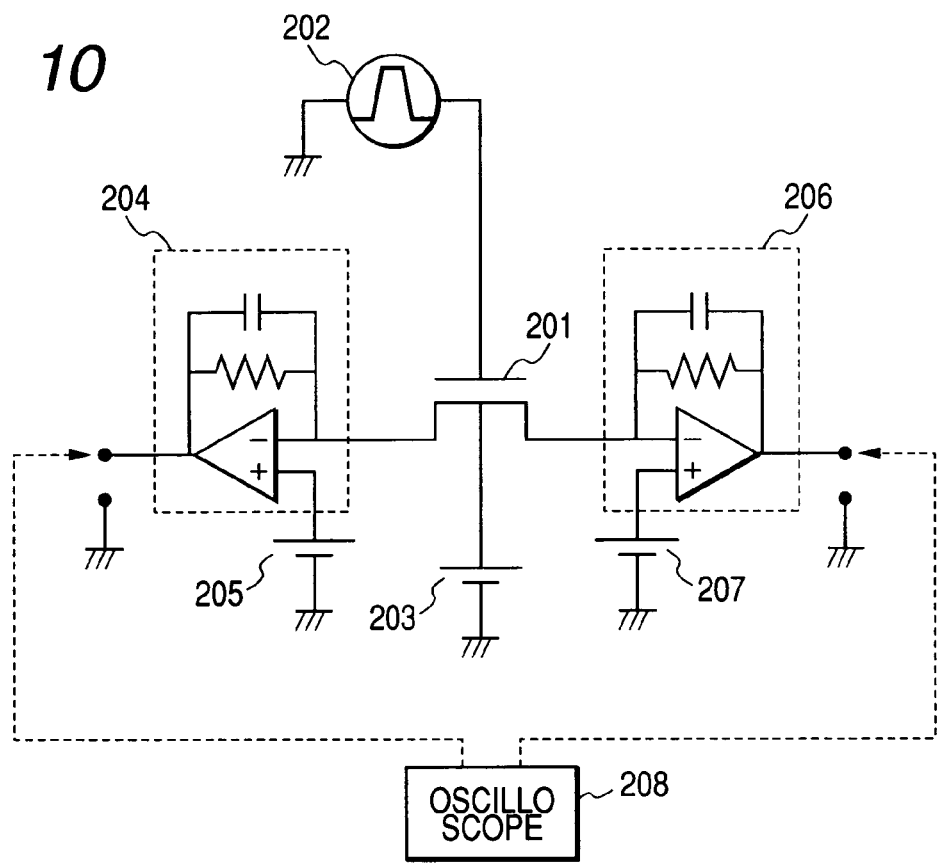
FIG. 10 is a circuit diagram showing an example of a semiconductor device evaluation apparatus according to a second embodiment.

FIG. 10 shows an example of the semiconductor device evaluation apparatus according to the second embodiment.

A pulse generator 202 is electrically connected to a gate electrode of an MISFET 201. A constant-voltage source 203 is electrically connected to a substrate of the MISFET 201. A current/voltage converter 204 is electrically connected to a source region of the MISFET 201. The electric potential of an input terminal of the current/voltage converter 204 is determined by a constant-voltage source 205. A current/voltage converter 206 is electrically connected to a drain region of the MISFET 201. The electric potential of an input terminal of the current/voltage converter 206 is determined by a constant-voltage source 207. Output voltages of the current/voltage converters 204 and 206 are simultaneously measured with an oscilloscope (voltmeter) 208 having a plurality of measurement terminals.

Of course, the apparatus and the MISFET are electrically connected to each other via terminals such as an input terminal, an output terminal, a gate electrode terminal, a source terminal, a drain terminal, a substrate terminal, etc.

On this occasion, the response speed and amplification factor of the current/voltage converter 204 may be equal to those of the current/voltage converter 206. Specifically, the difference between the current/voltage converters 204 and 206 may be in a range of from −15% to +15%, more specifically in a range of from −1% to +1%.

The response speed of the oscilloscope (voltmeter) 208 may be higher than that of each of the current/voltage converters 204 and 206. Specifically, the response speed of the oscilloscope 208 may be not lower than ten times the response speed of each of the current/voltage converters 204 and 206.

For example, Model-428 made by Keithley Instruments, Inc. can be used as a device having both of a function of the current/voltage converter 204 and a function of the constant-voltage source 205 or as a device having both of a function of the current/voltage converter 206 and a function of the constant-voltage source 207.

Any device can be used as the constant-voltage source 203. When the constant-voltage source 203 is used, desirable voltage can be applied to the substrate of the MISFET 101. Accordingly, mobility can be evaluated under any substrate bias condition. Of course, the constant-voltage source 203 can apply a voltage of 0 V. In this case, mobility can be evaluated under a zero substrate bias condition.

An example of a semiconductor device evaluation method using the semiconductor device evaluation apparatus according to the second embodiment will be described below on the assumption that the MOSFET 201 shown in FIG. 10 is an N-type MISFET.

First, a potential difference is formed between the source terminal and the drain terminal. Specifically, the constant-voltage source 205 is used for applying a voltage to the source terminal connected to the source region of the MISFET 201. Similarly, the constant-voltage source 207 is used for applying a voltage to the drain terminal connected to the drain region of the MISFET 201.

Typically, the constant-voltage source 205 is set at 0 V (e.g. Vs=0V) so that no voltage is applied to the source terminal, while a positive voltage with a small absolute value (e.g. Vd=+10 mV) is applied to the drain terminal by the constant-voltage source 207.

Incidentally, assuming a special case where the drain terminal is wrong in electric property compared with the source terminal for a certain reason so that a problem arises if the constant-voltage source 207 applies a voltage to the drain terminal. In that case, the constant-voltage source 207 can be set at 0 V (e.g. Vd=0V) to prevent the voltage from being applied to the drain terminal while the constant-voltage source 205 can apply a positive voltage with a small absolute value (e.g. Vs=+10 mV) to the source terminal to thereby make it possible to evaluate mobility. Accordingly, since the constant-voltage sources 205 and 207 are provided simultaneously, there is an advantage that even an MISFET having the special electric characteristic as described above can be evaluated.

Specific examples of the special case may include a MISFET, which is wrong in PN junction between the drain region and the substrate; a MISFET, which is wrong in insulating characteristic between the drain region and the gate electrode; a MISFET in which an impurity element forming the drain region and an impurity element in the substrate are of the same type (not forming a PN junction); and a MISFET in which the drain region and the substrate form a metal-semiconductor junction (Schottky junction).

Figure 11:
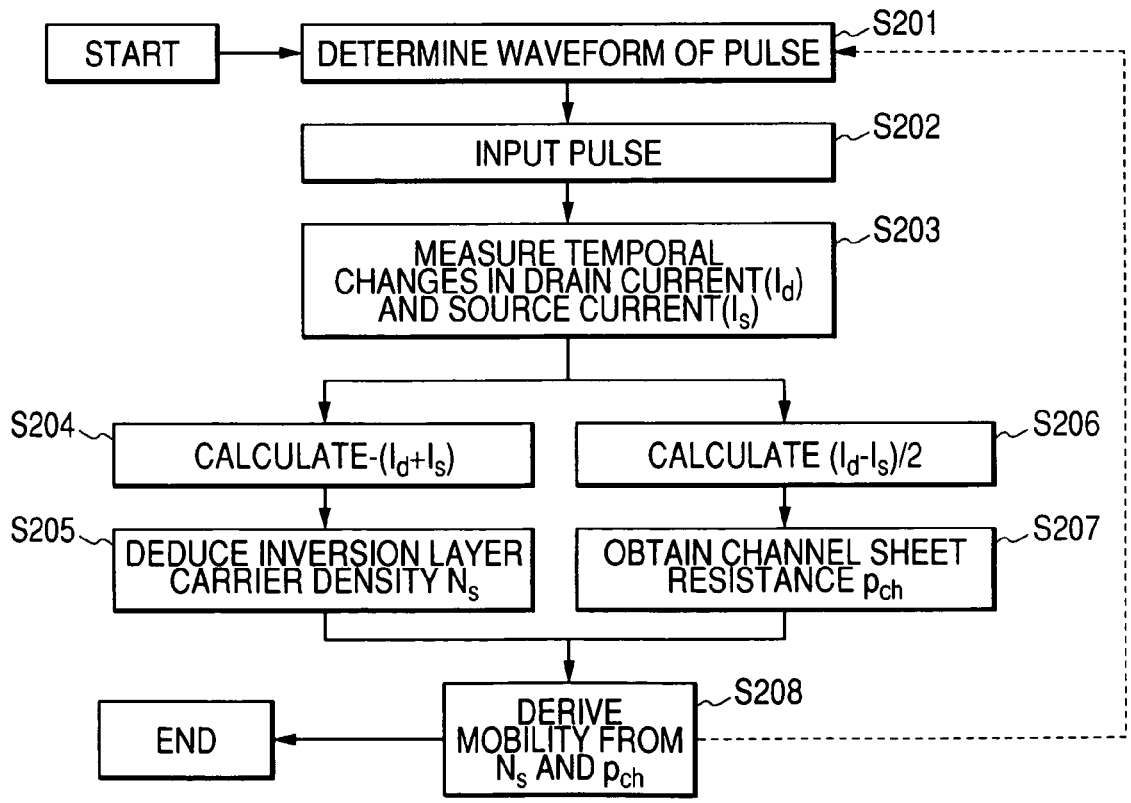
FIG. 11 is a flow chart showing an example of a semiconductor device evaluation method according to the second embodiment.

FIG. 11 shows a procedure for obtaining mobility of the MISFET. A series of steps consisting of steps S204 and S205 for estimating inversion layer carrier density Ns may be carried out before or after a series of steps consisting of steps S206 and S207 for estimating channel sheet resistance ρch. The respective steps will be described below in detail.

Step S201: This step determines the waveform of a pulse voltage applied from the pulse generator 202 to the gate electrode of the MISFET 201 in FIG. 10.

The details of the step S201 are the same as those of the step S101 except the following point.

In each of the pulse waveforms shown in FIGS. 4 and 5, the upper limit of the pulse width is defined on the basis of time constant of charge trapping, because electrification is caused by trapping of electric charge in the levels of the insulating film when the high voltage is applied for an excessively long time (pulse width is too long). On the other hand, to measure the current flowing in the channel of the MISFET with the oscilloscope 208 through the current/voltage converters 204 and 206, the high voltage needs to be kept while being applied for a predetermined time corresponding to the response speed of each of the current/voltage converters 204 and 206. The response speed of each current/voltage converter 204 and 206 is determined by a feedback loop of an operational (OP) amplifier inside the converter 204, 206. When a circuit having a resistor (R) and a capacitor (C) arranged in parallel to each other is used as the feedback loop, a characteristic response time is determined as RC, which defines the lower limit of the pulse width.

Step S202: The voltage pulse determined in the step S201 is input from the pulse generator 202 to the gate electrode of the MISFET 201. The pulse waveform shown in FIG. 4 or 5 is input as a monopulse.

To control the charge state of the levels in the insulating film on the basis of the reference voltage, the hold time of the reference voltage is required to be sufficiently longer than the time constant of charge trapping. Accordingly, a monopulse with the pulse waveform shown in FIG. 4 or 5 may be applied several times at intervals a lower limit of which is the time constant of charge trapping.

The repetition of application of the monopulse is effective in numerically averaging the output voltages of the current/voltage converters 204 and 206 with the oscilloscope 208 to thereby reduce the influence of noise in step S203, which will be described later.

For example, in the case of a high-k insulating film, the charge state of the levels sufficiently reaches an equilibrium state typically in a time of 100 μsec or longer. It is therefore preferable that the interval of application of the monopulse is set to be not shorter than 100 μsec when the monopulse is applied several times.

Particularly, in the case of hafnium silicate nitride, the charge state in the levels sufficiently reaches an equilibrium state typically in a time of 1 sec. Therefore, the interval of application of the monopulse may be equal to or longer than 1 sec when the monopulse is applied several times.

Figure 12:
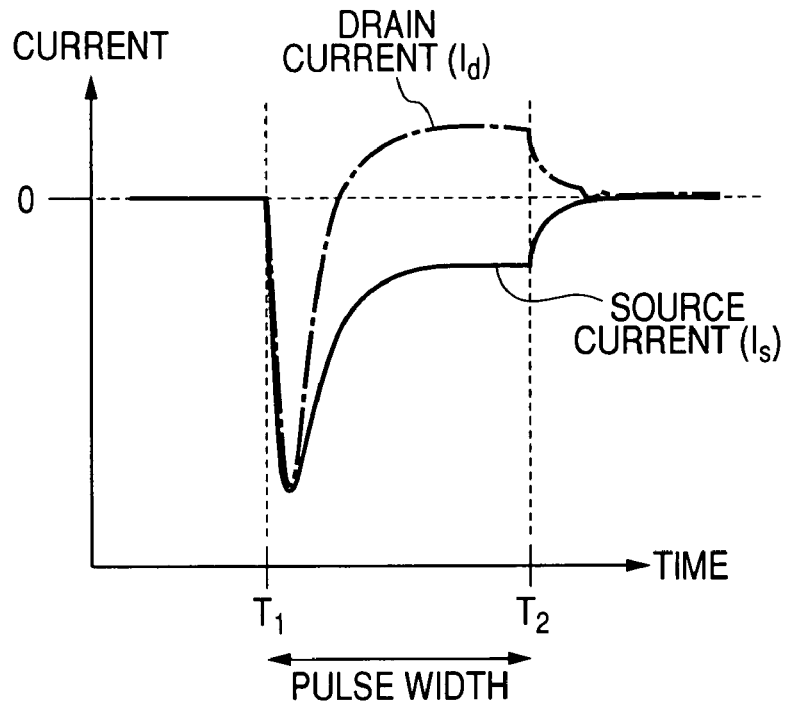
FIG. 12 is a graph showing temporal changes in source current and drain current in accordance with application of a pulse voltage.

Step S203: A source current and a drain current corresponding to the input of the pulse voltage are converted into voltage signals by the current/voltage converters 204 and 206, respectively. The voltage signals are measured with the oscilloscope 208. The temporal changes in the voltages measured with the oscilloscope 208 are converted into temporal changes in source current (Is) and drain current (Id) on the basis of conversion rates in the current/voltage converters 204 and 206, respectively. The source current Is and the drain current Id are defined on the assumption that the directions of the current flowing from the respective current/voltage converters to the source/drain terminals are a positive direction. The temporal change in each current is typically as shown in FIG. 12. In the time of application of the high voltage (i.e. in the pulse width), the source current and the drain current reach their minimum values and then converge into different predetermined current values, respectively.

Steps S204 and S205: The steps for estimating inversion layer carrier density Ns will be described.

Figure 13:
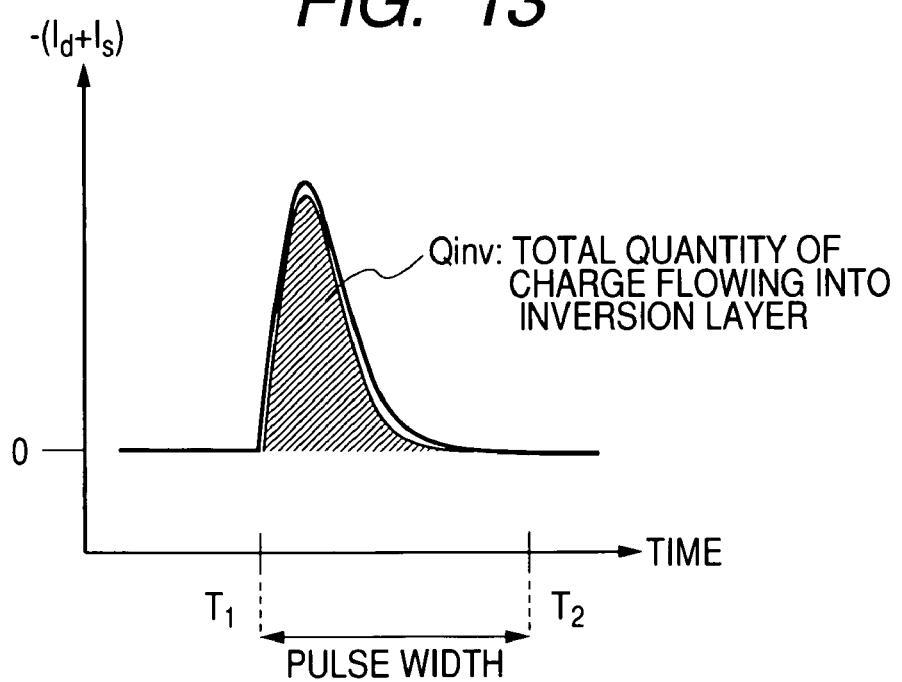
FIG. 13 is a graph showing temporal change in current used to estimate inversion layer carrier density.

Step S204: After −(Id+Is) is calculated, temporal change in the −(Id+Is) is plotted as shown in FIG. 13.

Step S205: The −(Id+Is) shown in FIG. 13 represents a flow of charge from the source region and the drain region into the inversion layer in a process of formation of the inversion layer. Therefore, −(Id+Is) is integrated with respect to time in the period of the pulse width to thereby calculate the total quantity Qinv of charge in the inversion layer. Inversion layer carrier density Ns is calculated in accordance with the expression Ns=Qinv/(eWL) in which e is elementary electric charge, W is the gate width of the MISFET 201, and L is the gate length of the MISFET 201.

Steps S206 and S207: The series of steps for estimating channel sheet resistance ρch will be described.

Figure 14:
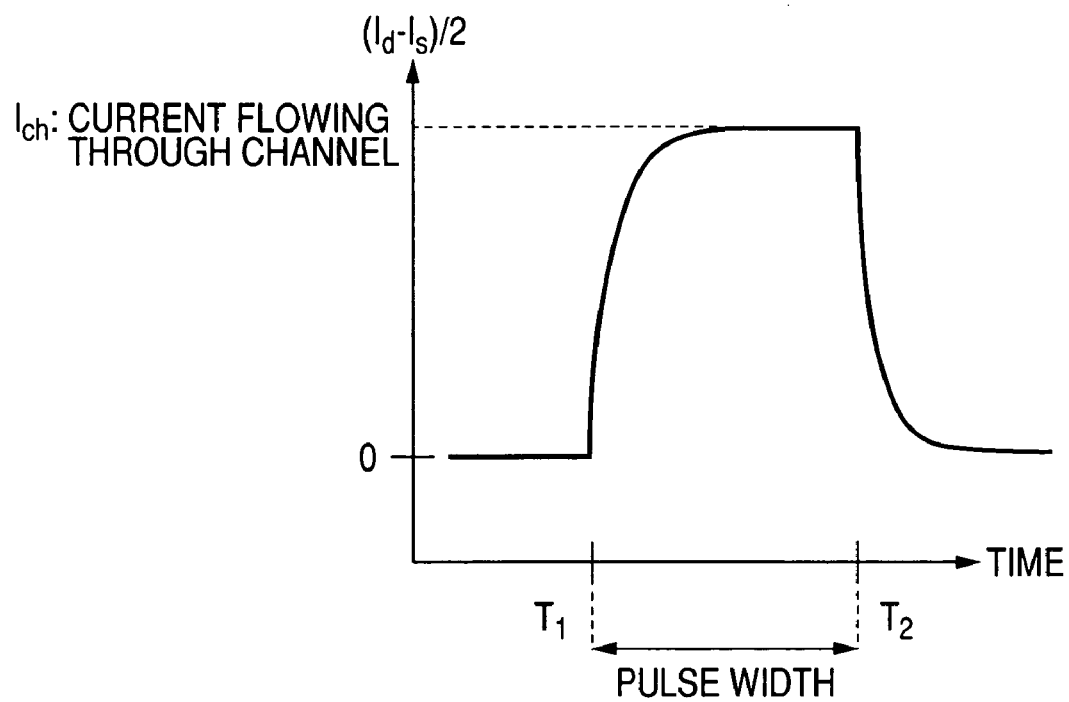
FIG. 14 is a graph showing temporal change in current used to estimate channel sheet resistance.

Step S206: After (Id−Is)/2 is calculated, temporal change in the (Id−Is)/2 is plotted as shown in FIG. 14. In the time of application of the high voltage (i.e. in the pulse width), (Id−Is)/2 converges into a certain value Ich.

Step S207: Ich in the step S206 is a current flowing in the channel of the MISFET 201. Channel sheet resistance ρch is calculated in accordance with ρch=(Vds/Ich) (W/L). Here, Vds is the potential difference between the source terminal and the drain terminal (e.g. Vds=Vd−Vs).

Step S208: Mobility μeff is obtained in accordance with μeff=1/(eρchNs).

Mobility is a physical quantity, which varies in dependence on the strength of the inversion state of the MISFET. The strength of the inversion state is determined uniquely in accordance with the voltage value of the high voltage provided as the pulse voltage applied to the gate electrode. Accordingly, when change in mobility in accordance with change in the inversion state of the MISFET needs to be evaluated, the current position of this routine goes back to the step S201 to change the voltage value of the high voltage suitably again and then repeat the steps S202, S203, S204, S205, S206, S207 and S208.

Figure 15:
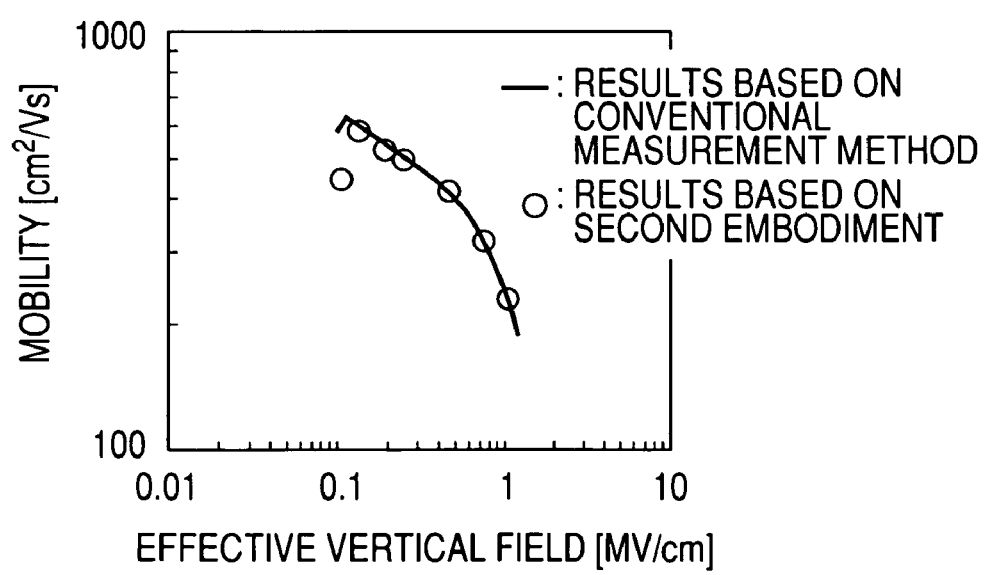
FIG. 15 is a graph showing mobility of an MISFET using $SiO_2$ as an electrically insulating film for comparison between the case where the mobility is deduced by the evaluation method according to the second embodiment and the case where the mobility is deduced by a conventional evaluation method.
Figure 16:
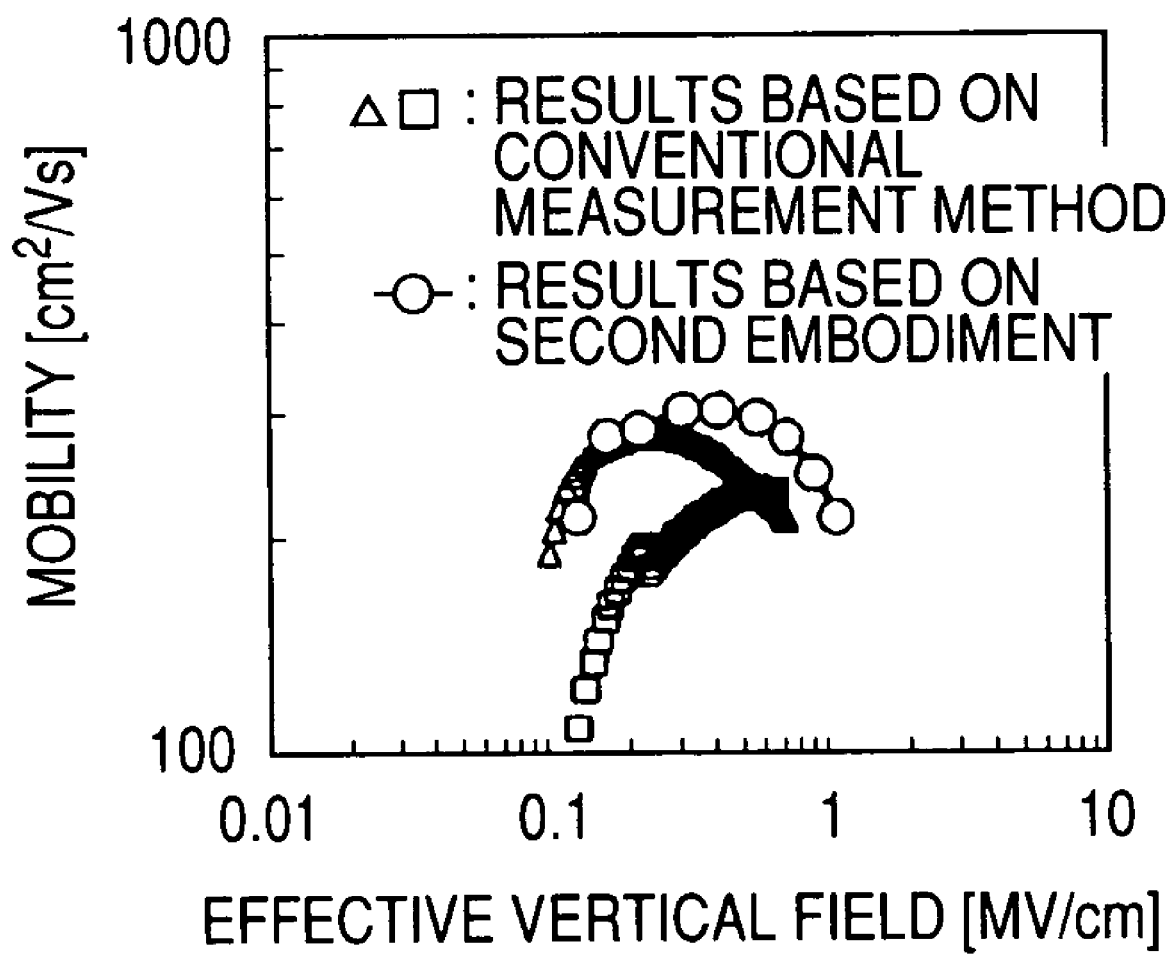
FIG. 16 is a graph showing mobility of an MISFET using a high dielectric constant material as an electrically insulating film for comparison between the case where the mobility is deduced by the evaluation method according to the second embodiment and the case where the mobility is deduced by a conventional evaluation method.

FIGS. 15 and 16 show examples of typical evaluation results. FIG. 15 shows the case where the gate insulating film is made of $SiO_2$. FIG. 16 shows the case where the gate insulating film is made of hafnium silicon oxynitride (Hf-SiON), which is one of high dielectric constant materials. In each of FIGS. 15 and 16, the vertical axis represents mobility and the horizontal axis represents effective vertical field, which is an index for indicating the strength of the inversion state of the MISFET. As the effective vertical field increases, the inversion state becomes stronger.

In the case where the gate insulating film is made of $SiO_2$ (FIG. 15), the result based on the example of the invention is well consistent with the result based on the conventional evaluation method (Split-CV method). In the case of $SiO_2$ in which the number of levels capable of trapping electric charge in the gate insulating film is small, it is known that mobility can be estimated sufficiently accurately by the conventional Split-CV method. It is apparent from FIG. 15 that mobility can be obtained accurately by use of the semiconductor device evaluation apparatus or the semiconductor device evaluation method according to the second embodiment.

On the other hand, in the case where the gate insulating film is made of hafnium silicon oxynitride (HfSiON), which is one of high dielectric constant materials (FIG. 16), the result based on the example of the invention is different from the result based on the conventional Split-CV method. Moreover, the result based on the example of the invention does not vary whereas the result based on the conventional Split-CV method varies.

This shows the fact that, when a large number of levels capable of trapping electric charge are in the gate insulating film, e.g. made of hafnium silicon oxynitride, mobility cannot be estimated correctly by the conventional Split-CV method because of the influence of the levels. On the contrary, this shows the fact that, when the evaluation apparatus according to the second embodiment of the invention is used, mobility can be estimated accurately without influence of the levels.

According to the second embodiment, a "mono"-pulse can be applied to the gate electrode to estimate mobility. Accordingly, the charge state in the gate insulating film of the MISFET 201 can be sufficiently prevented from being disturbed by application of the gate voltage.

According to the second embodiment, while one measuring system for measuring both Ns and ρch is used, a pulse voltage with the same waveform can be input to the gate electrode to estimate mobility. Accordingly, there is an advantage that mobility derived from Ns and ρch having strict correspondence with each other is very accurate.

According to the second embodiment, the following advantage can be obtained compared with the first embodiment.

In an MISFET in a triode operating state, it is known that inversion layer carrier density is not spatially uniform in the channel because of the influence of a very small potential difference between the source terminal and the drain terminal. In the known evaluation method, only approximate mobility in disregard of spatial ununiformity of inversion layer carrier density can be deduced because inversion layer carrier density is estimated under the condition that the potential of the source terminal is equal to the potential of the drain terminal. When strict evaluation of mobility is required, it is therefore necessary that the inversion layer carrier density deduced by the known evaluation method is corrected by a certain method in consideration of the influence of the potential difference.

On the other hand, in accordance with the second embodiment, inversion layer carrier density in the triode operating state is estimated directly. Accordingly, additional correction is not required, so that mobility can be evaluated accurately in consideration of spatial ununiformity.

In addition, in accordance with the second embodiment, the following advantage can be obtained compared with the first embodiment.

In the first embodiment, the switch 104 shown in FIG. 2 needs to be switched to perform measurement twice for estimating Ns and ρch respectively. On the contrary, in the second embodiment, both Ns and ρch can be estimated simultaneously by one measurement.

Although the embodiments of the invention have been described, the invention is not limited thereto and various modifications may be made within the gist of the invention, which is described in claims. Moreover, the invention can be changed variously in practical stages without departing from the gist of the invention. In addition, constituent members disclosed in the embodiments can be combined suitably to form various inventions.

What is claimed is:

1. A method for evaluating a field-effect transistor, comprising:
    forming a potential difference between a first terminal electrically connected to a source region of the field-effect transistor and a second terminal electrically connected to a drain region of the field-effect transistor;
    applying monopulse voltage to a gate electrode of the field-effect transistor to change the field-effect transistor from a depletion state to an inversion state;
    measuring temporal change in source current flowing through the first terminal when the monopulse voltage is applied;
    measuring temporal change in drain current flowing through the second terminal when the monopulse voltage is applied;
    obtaining a channel current in an operating state of the field-effect transistor, based on a current value calculated by dividing an algebraic difference between the source current and the drain current by 2;
    obtaining a quantity of inversion layer charge in the operating state of the field-effect transistor, based on a temporally integrated current value calculated as an algebraic sum of the source current and the drain current; and
    obtaining mobility of a carrier based on the channel current and the quantity of the inversion layer charge.

2. The method according to claim 1, wherein the monopulse voltage has a pulse width in a range of from 10 nsec to 0.1 sec.

3. The method according to claim 1, wherein the monopulse voltage has the pulse width in a range of from 100 nsec to 1 μsec.

4. The method according to claim 1, wherein the field-effect transistor comprises a gate insulating film a material of which is one selected from a group consisting of $Si_3N_4$, $Al_2O_3$, $Ta_2O_5$, $TiO_2$, $La_2O_5$, $CeO_2$, $ZrO_2$, $HfO_2$, $SrTiO_3$, $Pr_2O_3$, ZrSiO, HfSiO, LaSiO, ZrSiON, HfSiON and LaSiON.

* * * * *